United States Patent [19]
Moyer et al.

[11] Patent Number: 5,334,855
[45] Date of Patent: Aug. 2, 1994

[54] DIAMOND/PHOSPHOR POLYCRYSTALLINE LED AND DISPLAY

[75] Inventors: Curtis D. Moyer, Phoenix; James E. Jaskie; Ronald N. Legge, both of Scottsdale, all of Ariz.

[73] Assignee: Motorola, Inc., Schaumburg, Ill.

[21] Appl. No.: 933,837

[22] Filed: Aug. 24, 1992

[51] Int. Cl.$^5$ .................. H01L 33/00; H01L 29/161
[52] U.S. Cl. .......................... 257/13; 257/77; 257/94
[58] Field of Search .................. 257/13, 77, 85, 94

[56] References Cited

U.S. PATENT DOCUMENTS

| 5,034,784 | 7/1991 | Yamazaki | 257/94 |
| 5,131,065 | 7/1992 | Briggs et al. | 385/120 |

FOREIGN PATENT DOCUMENTS

| 0377320 | 7/1990 | European Pat. Off. | 257/13 |
| 0457076A2 | 11/1991 | European Pat. Off. | 257/14 |
| 62-218449 | 9/1987 | Japan | 257/13 |
| 1-265728 | 10/1989 | Japan | 257/13 |
| 3-281594 | 12/1991 | Japan | 257/13 |

Primary Examiner—Jerome Jackson
Assistant Examiner—D. Monin
Attorney, Agent, or Firm—Eugene A. Parsons

[57] ABSTRACT

A light emitting diode including a carrier injection layer of semiconductor material, such as diamond, and a light emitting layer of polycrystalline phosphor, such as zinc oxide, positioned to form a diode junction therebetween. The semiconductor material being selected to have a wider bandgap than the polycrystalline phosphor and the materials being further selected to minimize the discontinuities at the junction which would cause energy spikes.

14 Claims, 3 Drawing Sheets

DIAMOND/PHOSPHOR POLYCRYSTALLINE LED AND DISPLAY

The present invention pertains to light emitting diodes are more specifically to light emitting diodes utilizing a polycrystalline junction of semiconductor/phosphor.

BACKGROUND OF THE INVENTION

There have been demonstrated a large number of ways to generate light for use in displays. Incandescent lamps, arc lamps, electron bombardment of phosphors (CRT or Braun tube), electroluminescence by impact ionization or tunnel injection, injection and subsequent light generating recombination in single crystal light emitting diodes (LEDs) or lasers (diode lasers) and plasma discharge tubes are a few examples of light sources which have, or potentially might be, used in displays.

Incandescent, arc and plasma techniques of light generation all require carefully controlled atmospheres within sealed envelopes and suffer from basic wear-out mechanisms. Electron bombardment of phosphors, or cathode luminescence, requires a low pressure (i.e. 10–6 Torr.) sealed envelope for electron acceleration and the prevention of arcing. In addition, cathode luminescence requires the emission of electrons into the low pressure region which may be accomplished with thermionic emission from heated filaments, field emission, or other high electric field techniques, or by the use of low work function materials such as the hydrogenated <111> face of diamond in conjunction with moderate electric fields.

A significant reduction in the required device drive voltage without the need for a vacuum envelope can be attained by building LEDs as the light emitting element of a display. Commercially available LEDs span the green—red portion of the spectrum with blue LEDs having been demonstrated. Since these LEDs are typically made of SiC, GaP, AlGaAs, InGaAlP, all single crystal materials with appropriate N/P and/or isoelectronic doping, large displays are typically made of arrays of discrete LEDs soldered into a large panel. Arraying discrete LEDs is costly and limits the pixel density. Large single crystals are expensive, available in limited sizes and contain defects that limit the potential yield of direct view display approaches based on using large single crystal substrates.

Some heterojunction approaches to light emitters have been discussed in the literature, such as the possibility of making LEDs by utilizing compounds of column II and VI of the periodic table as light emitting material and utilizing other II and VI compounds or group IV materials to form heterojunction LEDs. This literature cites dopability, band offset values and lattice match as the principal criterion for combining materials. Lattice match is especially stressed, with emphasis on the criterion that the materials must be approximately lattice-matched to allow the fabrication of high-quality, dislocation-free interfaces.

SUMMARY OF THE INVENTION

It is a purpose of the present invention to provide a new and improved semiconductor/phosphor polycrystalline light emitting diode.

It is a further purpose of the present invention to provide a new and improved semiconductor/phosphor polycrystalline light emitting diode which has improved efficiency, lower operating voltage and increased reliability.

These purposes and others are realized and the above problems are at least partially solved by a semiconductor/phosphor polycrystalline light emitting diode having a carrier injection layer including a semiconductor material with a selected bandgap, a light emitting layer including a polycrystalline phosphor material with a selected bandgap positioned on a surface of the carrier injection layer so as to form a junction therebetween, and the semiconductor material and the polycrystalline phosphor material being selected so that the bandgap of the semiconductor material is wider than the bandgap of the polycrystalline phosphor material.

These purposes and others are further realized and the above problems at least partially solved by a method of manufacturing a semiconductor/phosphor polycrystalline light emitting diode including the steps of forming a carrier injection layer including a semiconductor material with a selected bandgap, forming a light emitting layer including a polycrystalline phosphor material with a selected bandgap on a surface of the carrier injection layer so as to form a junction therebetween, and selecting the semiconductor material and the polycrystalline phosphor material so that the bandgap of the semiconductor material is wider than the bandgap of the polycrystalline phosphor material and discontinuities at the junction which would cause energy spikes are minimized.

BRIEF DESCRIPTION OF THE DRAWINGS

Referring to the drawings.

DESCRIPTION OF THE PREFERRED EMBODIMENT

Figure 1:
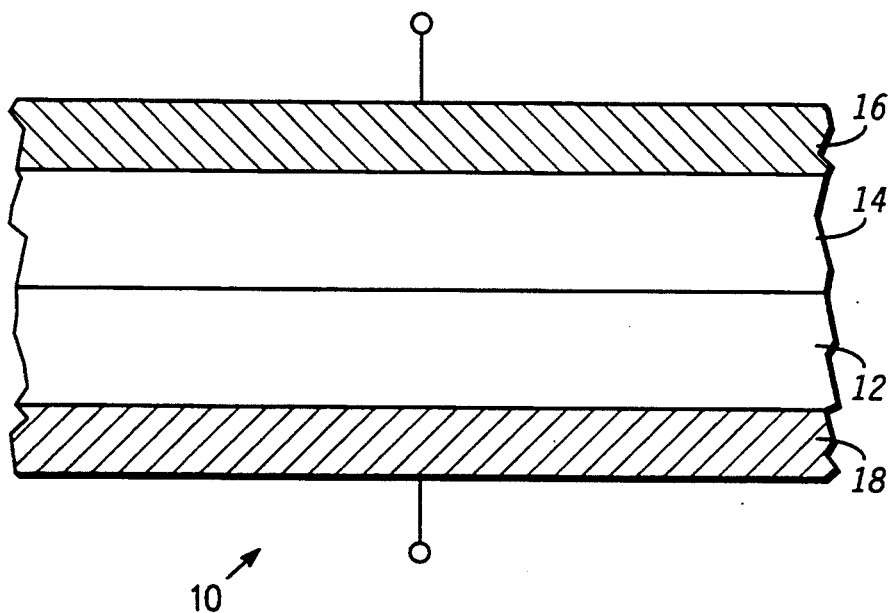
FIG. 1 is a simplified view in cross section of a semiconductor/phosphor polycrystalline light emitting diode embodying the present invention.

Referring specifically to FIG. 1, a simplified view in cross section of a semiconductor/phosphor polycrystalline light emitting diode 10 embodying the present invention is illustrated. Diode 10 includes a layer 12 of N-type polycrystalline phosphor material, such as ZnO:Zn, ZnS, CdS, ZnCdS, ZnCdSe, ZnSe, or any of the other well known materials which operate to emit light when properly energized. Diode 10 further includes a layer 14 of semiconductor material having an energy bandgap greater than the energy bandgap of the polycrystalline phosphor material. Layer 14 is positioned on layer 12 so as to form a junction therebetween and a layer 16 of metal contact material is positioned on the opposite side of layer 14. A layer 18 of an electrical conductor which is optically transparent is positioned on the side of layer 12 opposite the junction with layer 14. Layer 18 is a material such as indium tin oxide (ITO) or cadmium tin oxide which are well known in the art and utilized in many applications as an electrical contact in optical devices because of the transparency to light waves. It will of course be understood by those skilled in the art that layers 12, 14, 16 and 18 can be deposited or formed in any convenient order depending upon the methods utilized, the specific materials included and the application.

In a preferred embodiment, layer 14 is formed of P-type (boron doped) polycrystalline diamond by plasma chemical vapor deposition, hot filament chemical vapor deposition, laser ablation techniques, or other doping capable deposition techniques well known in the art. Most of the techniques available for forming P-type polycrystalline diamond utilize temperatures of 800-900 degrees Centigrade; thus, it is preferred to form layer 14 prior to layer 12. N-type polycrystalline phosphor layer 12 may be formed by metal organic vapor deposition (MOCVD), sputtering, powder deposition or wet chemistry, or other techniques well known in the art. Layer 12 may require a heat treatment in order to improve light emission efficiency, and the inert, temperature tolerant nature of previously formed P-type polycrystalline diamond film layer 14 allows heat treatment of layer 12.

Figure 2:
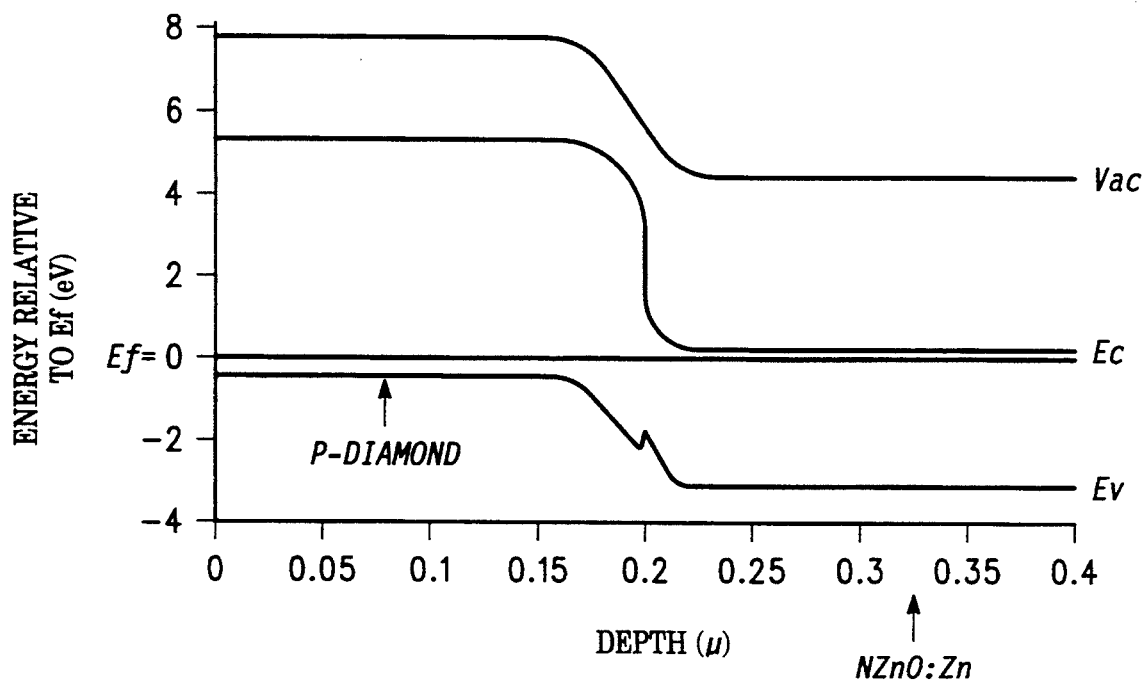
FIG. 2 is an energy diagram of the diode of FIG. 1 utilizing the (100) surface of a diamond semiconductor at the diode junction.

Referring specifically to FIG. 2, a Fermi energy level diagram for diode 10 is illustrated wherein layer 12 of polycrystalline phosphor material is chosen to be ZnO:Zn with an N-type conduction and layer 14 of semiconductor material is chosen to be diamond doped for a P-type conduction. FIG. 2 illustrates a curve, Vac, depicting the energy required to emit electrons from the material into free space (vacuum), a curve, Ec, depicting the conduction band and a curve, Ev, depicting the valence band. In the diamond material, which is doped for a P-type conduction, holes are the majority carrier and, hence, layer 14 is a hole injection layer. Layer 12, in which electrons are the majority carrier, emits light upon the injection of holes therein and the recombination of the injected holes with electrons.

It should be noted from FIG. 2 that the bandgap (distance between the valence band, Ev, and the conduction band, Ec) of the diamond material is wider than the bandgap of the polycrystalline phosphor material. In this instance the term "wider" means at least three kT wider at room temperature, where k is Boltzmann's constant and T is temperature in Kelvin and one kT equals approximately 26 millielectron volts at room temperature. It should also be noted that the materials are chosen to minimize band discontinuities therebetween which would cause energy spikes. In the present example, which illustrates a heterojunction interface between the (100) diamond surface and the ZnO:Zn, there is a very small energy spike in the valence band which holes must overcome to travel from the diamond to the ZnO:Zn.

It should be understood that holes and electrons normally recombine through a defect state, generally referred to as a recombination center. Depending upon the energy jump the electron makes to recombine with a hole (position of the recombination center), the recombination center may be a radiative or non-radiative recombination center. When a surface is formed on a polycrystalline material or when a surface is reconfigured, defects in the crystalline structure are formed. Defects in the crystalline structure, either in the crystal bulk or due to the existence of free surfaces, introduce additional allowed energy states into the Fermi energy level diagram. If the additional energy states occur at the junction or in the recombination region of phosphor and the additional energy states fall closely spaced within the bandgap, injected holes and electrons may recombine through these states creating thermal energy instead of light.

Lattice-matching of materials is not a problem if the non-radiative recombination centers at defects or free surfaces are eliminated by passivation or the materials are specifically chosen so that defects caused by the surface reconfiguration are outside of the bandgap. The only constraint on defects that may be formed near the heterojunctions is that they do not compromise device usefulness or that the defects can be treated (passivated) in a way that is sufficient to maintain device usefulness. ZnCdS may be coated with a thin layer of ZnO, for example, to passivate the ZnCdS. The object of passivation is to change or move non-radiative defects or non-radiative surface states, thereby minimizing device degradation. Dislocations and grain boundaries in polycrystalline silicon are often passivated with hydrogen which attaches to dangling bonds at the dislocations or grain boundaries and shifts the defect energy states to levels that are less disruptive of devices built in that material. Buried heterostructure lasers made of AlGaAs and GaAs incorporate an overgrowth of AlGaAs on the active GaAs material so that minority carriers in the active GaAs are surrounded by wider bandgap AlGaAs which prevents the minority carriers from reaching non-radiative free surfaces. ZnO is generally self-passivated. Excess Zn is introduced into ZnO as an impurity to intentionally form defect structures, sometimes referred to as "traps". The traps form a few (1 or 2) energy levels within the band where those energy levels form radiative recombination centers at a desired wavelength.

Placing a positive bias voltage across diode 10 from layer 16 to layer 18, causes electrons in the ZnO:Zn valence band to flow into the diamond layer 14 with only a slight hindrance due to the small spike. The band alignment combined with the wide bandgap of the diamond compared to that of ZnO causes an energy barrier in the conduction band preventing conduction band electrons from flowing into the diamond from the ZnO. Thus, in the same manner as a heterojunction diode, hole formation in the narrower bandgap ZnO:Zn is achieved. In the ZnO:Zn, electrons transiting from the conduction band through a trap (radiative) to the formed holes in the valence band completes the current flow path in the diode and generates the desired light.

Figure 3:
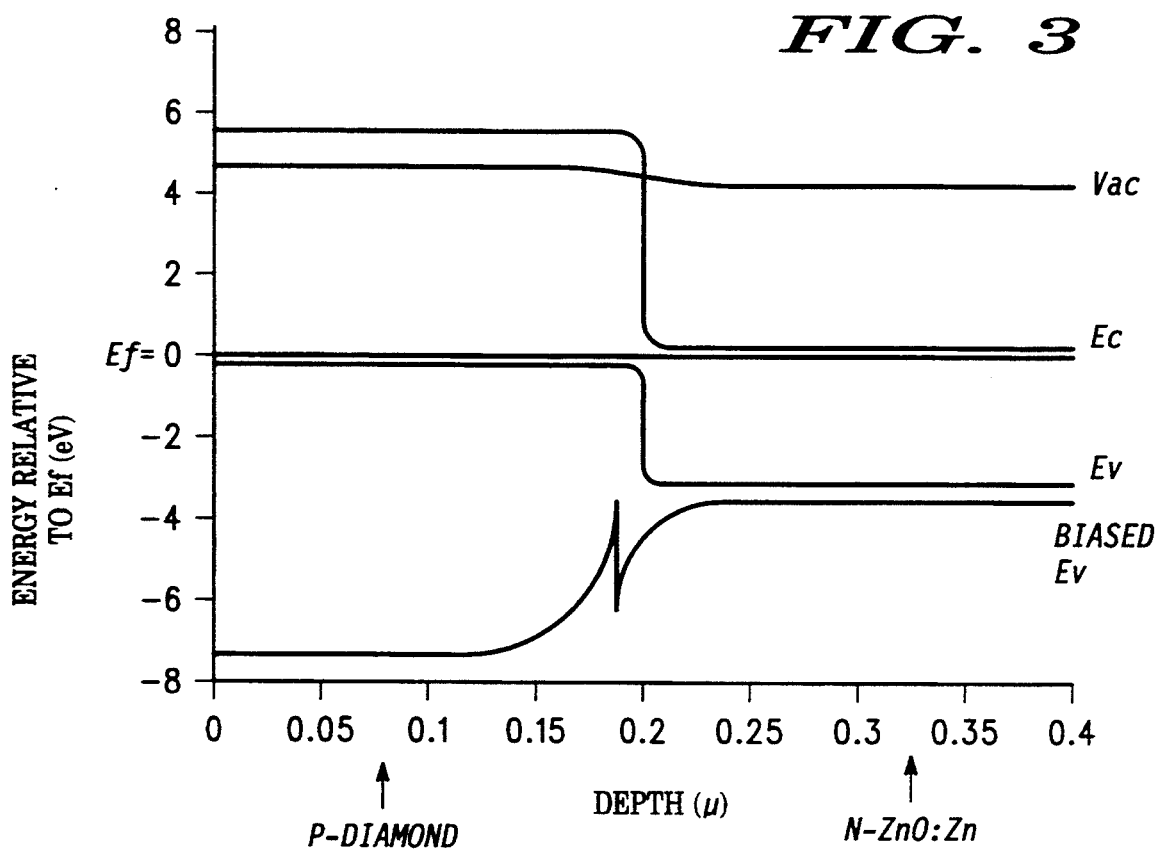
FIG. 3 is an energy diagram, similar to FIG. 2, utilizing the (111) surface of a diamond semiconductor at the diode junction.

Referring to FIG. 3, a Fermi energy level diagram for diode 10 is illustrated wherein layer 12 of polycrystalline phosphor material is chosen to be ZnO:Zn with an N-type conduction and layer 14 of semiconductor material is chosen to be diamond doped for a P-type conduction and a heterojunction interface between the (111) diamond surface and the polycrystalline phosphor is illustrated. In this example it can be seen that a large band discontinuity exists at the diamond/ZnO:Zn interface. As approximated by the biased valence band curve, the discontinuity becomes a large spike when a forward bias is applied to diode 10. The spike acts as a barrier to electron movement from the ZnO;Zn valence band to the diamond valence band. Thus according to the Anderson model, for the <111> diamond surface a higher applied voltage is required to form holes in the ZnO:Zn. Also, the holes formed are deeper in the valence band, and thus more energetic (hot holes), than in the previously described <100> diamond surface. Further, the higher bias voltage can lead to loss of electrons from the ZnO:Zn conduction band into the diamond conduction band. The loss of injection efficiency and the hot holes both lead to a less efficient luminescent device than the device described in conjunction with FIG. 2.

Thus, polycrystalline phosphor compounds (compounds, for example, made of combinations of group II and VI elements of the periodic table) that are efficient light emitters with passivatable or inherently passivated surfaces are combined with polycrystalline diamond materials to form polycrystalline heterojunction light emitting diodes. In the examples given, the light emission originates in the N-type polycrystalline phosphor, P-type polycrystalline diamond is used to achieve efficient hole injection into the polycrystalline phosphor and no vacuum is required. Other polycrystalline phosphor systems such as N-type ZnS, ZnCdS, CaS, etc are also applicable to the disclosed device with varying "spike" amplitudes and varying passivation characteristics leading to variations in net efficiency. The use of several different phosphors in the same device leads to color tailoring the device for a given application and the option of constructing color displays of high efficiency with low cost and without vacuum packaging.

Figure 4:
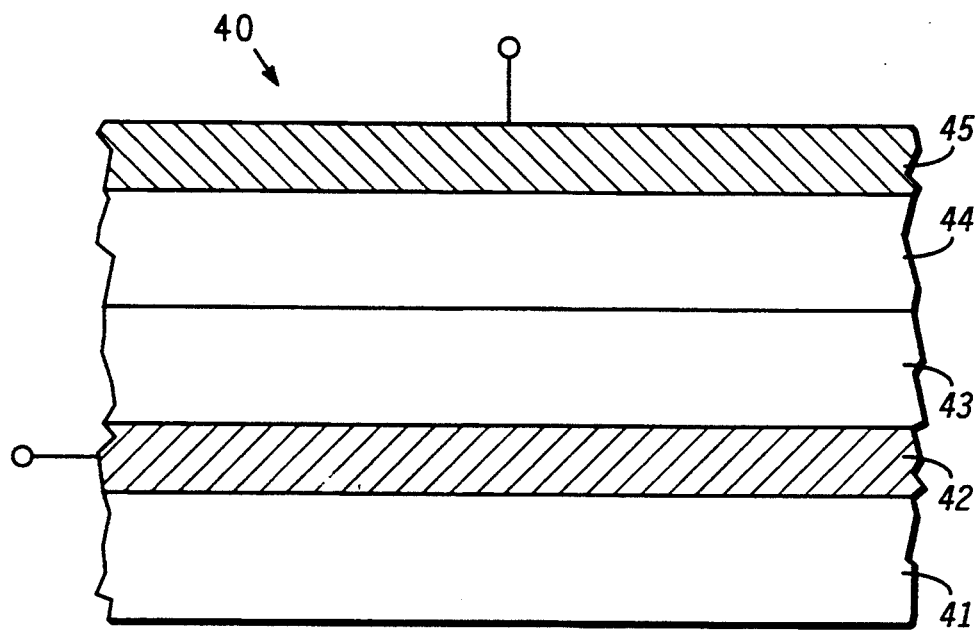
FIG. 4 is a simplified view in cross section of another embodiment of a semiconductor/phosphor polycrystalline light emitting diode incorporating the present invention.

FIG. 4 is a simplified view in cross section of another embodiment of a semiconductor/phosphor polycrystalline light emitting diode 40 incorporating the present invention. Diode 40 is constructed by starting with an optically transparent base 41 formed of some convenient material such as glass. A layer 42 of optically transparent conductive material is deposited on the surface of base 41 to form a first electrical contact. In this specific embodiment layer 42 is formed of indium tin oxide. A carrier injection layer 43 of semiconductor material which is optically transparent is deposited on layer 42. A typical example of an optically transparent semiconductor material is diamond. Next a light emitting layer 44 of polycrystalline phosphor material is deposited on carrier injection layer 43. Finally, an electrically conductive layer 45 is deposited on light emitting layer 44 to form a second electrical contact. Since it is desirable that all light emitted by layer 44 be directed through layers 43, 42 and 41, layer 45 is any convenient metal.

Figure 5:
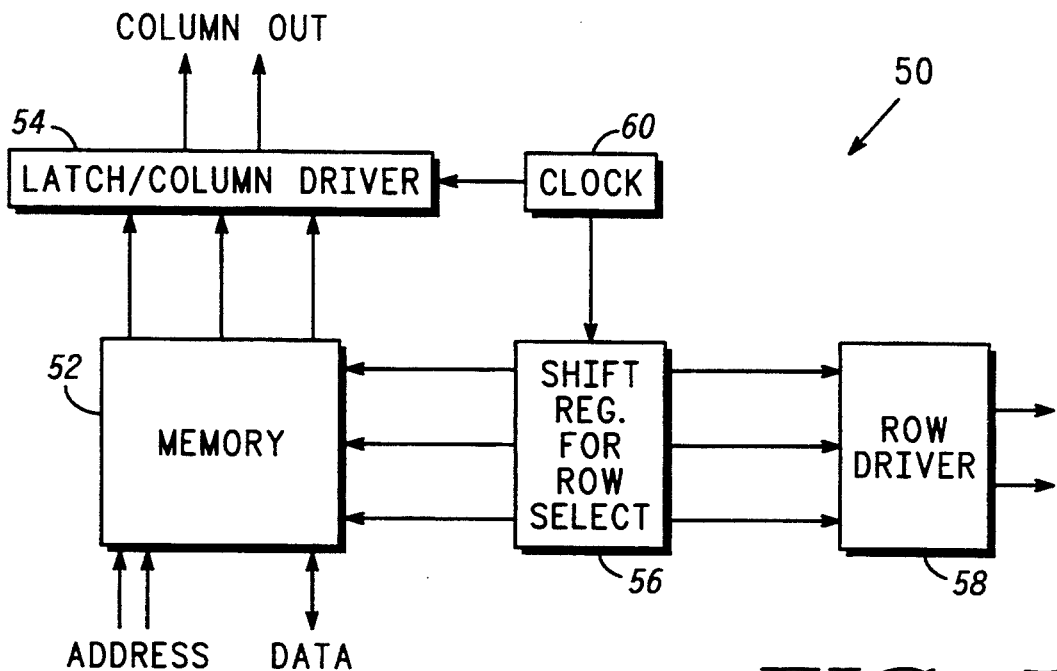
FIG. 5 is a simplified block diagram of driver circuitry, for driving a matrix display, such as illustrated in FIG. 6.

While semiconductor/phosphor polycrystalline light emitting diodes constructed in accordance with the present invention have a large variety of uses which will be apparent to those skilled in the art, these diodes are especially adaptable to displays. An example of such a display is illustrated in simplified block diagrams in FIGS. 5 and 6. Referring specifically to FIG. 5, driver circuitry 50 is illustrated in a simplified block diagram. Circuitry 50 includes a memory 52, column output circuitry 54, row selection circuitry 56, row driver circuitry 58 and a clock 60. In this embodiment, circuitry 50 is formed on a single semiconductor chip the surface of which generally corresponds to the surface of FIG. 6. Memory 52 is, for example, any of the electronic memories available on the market including but not limited to ROMs, PROMs, EPROMs, EEPROMs, RAMs etc. Driver circuitry 50 is designed to operate with a specific image generator, to be described presently, which image generator is useful in portable communications equipment and the like because of extremely low power requirements.

Image information is supplied to memory 52 by way of the data input and is stored in a predetermined location by means of an address supplied to the address input. The stored data is supplied to the display a complete row at a time by way of latch/column driver 54. Each bit of data for each column in the row is accessed in memory 52 and transferred to a latch circuit. The data may simply be sampled, actually removed from the memory and the memory refreshed, or new data introduced, while the current data is latched into the latch circuit. The current data is then supplied to the column drivers to drive each pixel in the row simultaneously. At the same time, shift register 56 is sequentially selecting a new row of data each time a pulse is received from clock 60. The newly selected row of pixels is actuated by row drivers 58 so that data supplied to the same pixels by latch/column drivers 54 causes the pixel to emit the required amount of light.

Figure 6:
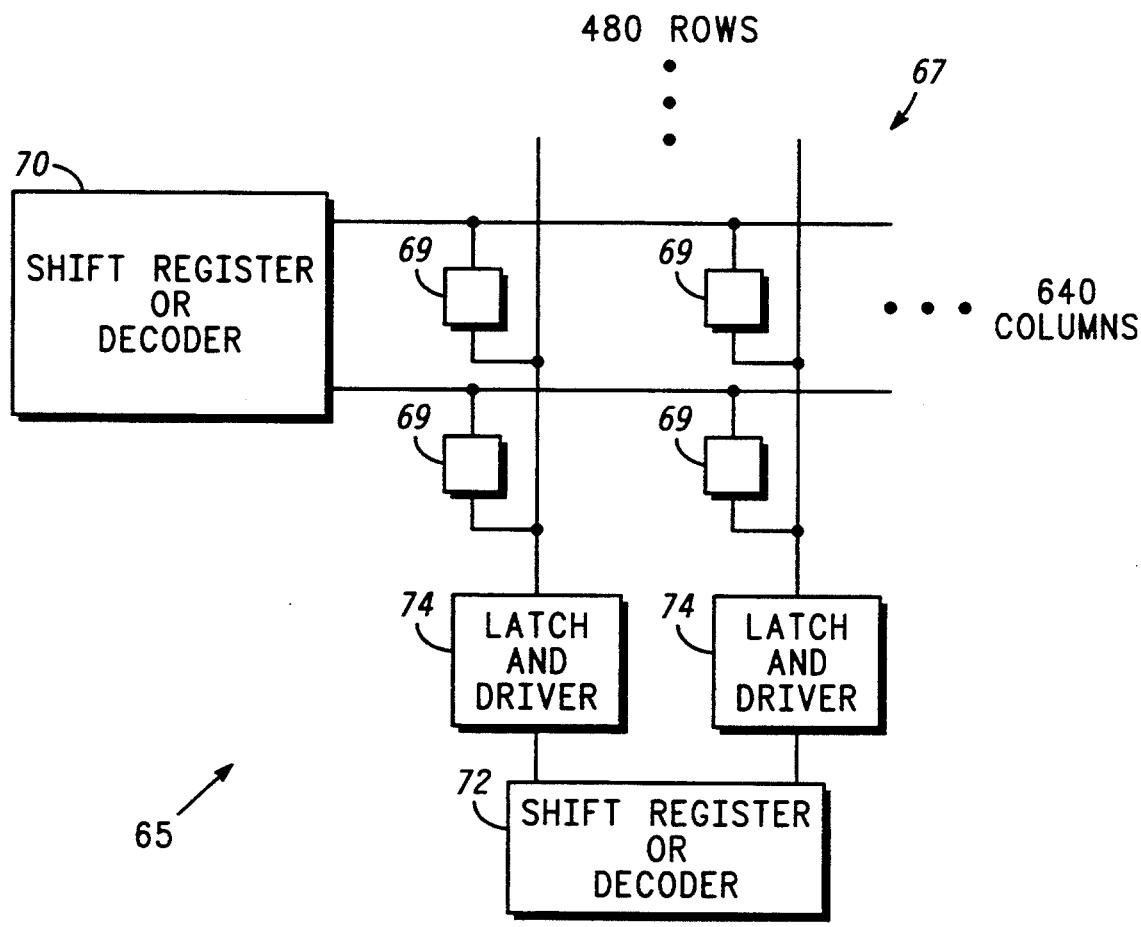
FIG. 6 is a block diagram of a matrix display incorporating semiconductor/phosphor polycrystalline light emitting diodes constructed in accordance with the disclosed method.

Referring to FIG. 6, a block diagram of a matrix display 65, portions thereof removed, is illustrated. Display 65 includes an image generator 67 with a plurality of pixels 69 each having at least one semiconductor/phosphor polycrystalline light emitting diode, with the pixels being connected in a matrix of rows and columns. In this particular embodiment the rows contain 640 pixels and the columns contain 480 pixels, which in this embodiment is a complete page (image). Display 65 further includes driver circuitry 50 from FIG. 5. As illustrated in FIG. 6, a shift register or decoder 70 is connected to the row inputs of image generator 67 and a shift register or decoder 72 is connected through a plurality of latch and driver circuits 74 to the column inputs of image generator 67. Shift register or decoder 70 may be, for example, shift register 56 and row driver 58 of FIG. 5. Shift register or decoder 72 is, for example, a portion of memory 52 of FIG. 5. In this configuration with pixels 69 including semiconductor/phosphor polycrystalline light emitting diodes, a first electrical contact of each diode is connected to the row lines and a second electrical contact of each diode is connected to the column lines.

In the operation of matrix display 65, one row of display data is loaded into latch & driver circuits 74 associated with each of the column lines. Once this has been accomplished, a row is selected and energized by shift register or decoder 70, illuminating the appropriate pixels 69 according to the data stored in latch & driver circuits 74. While the selected row is being energized, the display data corresponding to the next row in the sequence is loaded into latch & driver circuits 74 and the procedure is repeated. Assuming a repetition rate of 60 frames per second, each row is illuminated for approximately 35 microseconds.

There are two basic approaches for energizing the appropriate row and for transferring data to the appropriate columns. One approach uses decoders while the other approach uses shift registers. In the decoder approach, each row or column is individually addressed. The number of rows in matrix display 65, for example, requires a 9 bit address while the number of columns requires a 10 bit address. The circuitry required to sequence through the addresses is well understood by those skilled in the art and is not included herein for simplicity. The shift register approach takes advantage of the fact that random access to the rows and columns is not generally required in matrix displays, they need only be addressed sequentially. The advantage to the shift register approach is that it only requires a clock and a pulse to initiate a new row sequence. Both approaches are believed to have applications in matrix displays.

It should also be noted that the matrix display could be a simple monochrome configuration, a display utilizing monochrome grayscale, or color. For a simple monochrome display, only a one bit digital signal is needed for each pixel, as the pixel is either on or off. For a display utilizing a monochrome grayscale, either an analog signal or a multi-bit digital signal is required. A sixteen level grayscale, for example, needs a four bit digital signal. A grayscale could also be created utilizing pulse code modulation techniques. Full color, generally requires at least three light emitting elements per pixel, one for each of the basic colors (red, green and blue), and a type of grayscale signal system to achieve the appropriate amount of each color. The semiconductor/phosphor polycrystalline light emitting diode is easily adaptable to color displays by including, for example, different polycrystalline phosphor systems, as described above.

Thus, a new and improved semiconductor/phosphor polycrystalline light emitting diode is disclosed with improved efficiency and reliability. Further, because the diode is solid state, it does not require vacuum packaging or gas fill packaging. Also, the diode is not single crystal, thus it has a potential for large area devices, low cost, low power and relatively easy color display applications. It is anticipated that the diode will be especially useful in image generators for portable displays in portable communication devices, such as portable radios, pagers, portable computers and calculators, etc.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A semiconductor/phosphor polycrystalline light emitting diode comprising:
   a carrier injection layer including a semiconductor material with a selected bandgap;
   a light emitting layer including a polycrystalline phosphor material with a selected bandgap positioned on a surface of the carrier injection layer so as to form a junction therebetween, the light emitting layer emitting substantially all of the light of the light emitting diode; and
   the semiconductor material and the polycrystalline phosphor material being selected so that the bandgap of the semiconductor material is wider than the bandgap of the polycrystalline phosphor material.

2. A semiconductor/phosphor polycrystalline light emitting diode as claimed in claim 1 wherein the semiconductor material and the polycrystalline phosphor material are selected so that the discontinuities at the junction which would cause energy spikes are minimized.

3. A semiconductor/phosphor polycrystalline light emitting diode as claimed in claim 1 wherein the semiconductor material of the carrier injection layer has a first conductivity type and the polycrystalline phosphor material includes a passivated polycrystalline phosphor of opposite conductivity type to the first conductivity type of the semiconductor layer.

4. A semiconductor/phosphor polycrystalline light emitting diode comprising:
   a layer of polycrystalline diamond; and
   a layer of polycrystalline phosphor material positioned on a surface of the layer of polycrystalline diamond and forming a junction therebetween, the layer of polycrystalline diamond serving as a carrier injection layer and the layer of polycrystalline phosphor material emitting substantially all of the light in response to injection of carriers therein.

5. A semiconductor/phosphor polycrystalline light emitting diode comprising:
   a hole injection layer including polycrystalline P-type diamond; and
   a light emitting layer including a N-type polycrystalline phosphor material positioned on a surface of the electron injection layer and forming a junction therebetween, the polycrystalline phosphor layer emitting substantially all of the light of the light emitting diode.

6. A semiconductor/phosphor polycrystalline light emitting diode comprising:
   a hole injection layer including polycrystalline P-type diamond; and
   a light emitting layer including a N-type polycrystalline phosphor material positioned on a surface of the electron injection layer and forming a junction therebetween, wherein the N-type polycrystalline phosphor material of the light emitting layer is selected from one of the group consisting of ZnO, ZnS, CdS, ZnCdS, ZnCdSe and ZnSe.

7. A semiconductor/phosphor polycrystalline light emitting diode comprising:
   a hole injection layer including polycrystalline P-type diamond; and
   a light emitting layer including a N-type polycrystalline phosphor material positioned on a surface of the electron injection layer and forming a junction therebetween, wherein the N-type polycrystalline phosphor material of the light emitting layer includes ZnO:Zn.

8. A semiconductor/phosphor polycrystalline light emitting diode as claimed in claim 5 wherein the light emitting layer is positioned on a (100) surface of the polycrystalline P-type diamond.

9. A semiconductor/phosphor polycrystalline light emitting diode as claimed in claim 5 wherein the light emitting layer is positioned on a (111) surface of the polycrystalline P-type diamond.

10. A semiconductor/phosphor polycrystalline light emitting diode comprising:
    a carrier injection layer including polycrystalline diamond;
    a light emitting layer including a polycrystalline phosphor material positioned on a surface of the carrier injection layer and forming a junction therebetween;
    an electrical contact positioned on a surface of the carrier injection layer opposite the surface having the light emitting layer deposited thereon; and
    an electrical contact positioned on a surface of the light emitting layer opposite the junction with the carrier injection layer and formed to allow the emission of light from the light emitting layer, substantially all of the light being emitted by the polycrystalline phosphor material.

11. A semiconductor/phosphor polycrystalline light emitting diode as claimed in claim 10 wherein the electrical contact positioned on a surface of the light emitting layer includes indium-tin-oxide.

12. A semiconductor/phosphor polycrystalline light emitting diode comprising:

an optically transparent base member;

an electrical contact layer positioned on a surface of the base member, the contact layer being formed to allow the emission of light therethrough;

a carrier injection layer including polycrystalline diamond positioned on the contact layer;

a light emitting layer including a polycrystalline phosphor material positioned on the carrier injection layer and forming a junction therebetween; and an electrical contact positioned on a surface of the light emitting layer opposite the carrier injection layer, the light emitting layer emitting substantially all of the light through the carrier injection layer, the electrical contact layer and the base member in response to the injection of carriers into the light emitting layer.

13. An array of semiconductor/phosphor polycrystalline light emitting diodes comprising:

a plurality of semiconductor/phosphor polycrystalline light emitting diodes positioned in a regular pattern of rows and columns, each diode including a carrier injection layer including a semiconductor material with a selected bandgap;

a light emitting layer including a polycrystalline phosphor material with a selected bandgap positioned on a surface of the carrier injection layer so as to form a junction therebetween, the polycrystalline phosphor layer emitting substantially all of the light of the light emitting diode; and the semiconductor material and the polycrystalline phosphor material being selected so that the bandgap of the semiconductor material is wider than the bandgap of the polycrystalline phosphor material and discontinuities at the junction which would cause energy spikes are minimized; and the carrier injection layer of each diode being connected to the carrier injection layer of each other diode in the same row and the light emitting layer of each diode being connected to the light emitting layer of each other diode in the same column to form a diode array.

14. An array of semiconductor/phosphor polycrystalline light emitting diodes as claimed in claim 13 including in addition selection and driver circuits connected to the rows and columns for activating the plurality of semiconductor/phosphor polycrystalline light emitting diodes to provide a desired image.

* * * * *